(12) United States Patent
Hirata (10) Patent No.: US 10,573,505 B2
(45) Date of Patent: Feb. 25, 2020

(54) SIC WAFER PRODUCING METHOD (71) Applicant: DISCO CORPORATION, Tokyo (JP)

(72) Inventor: Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 212 days.

(21) Appl. No.: 15/883,297

(22) Filed: Jan. 30, 2018

(65) Prior Publication Data
US 2018/0218896 A1    Aug. 2, 2018

(30) Foreign Application Priority Data

Jan. 31, 2017   (JP) .................................. 2017-015742

(51) Int. Cl.
| | |
|---|---|
| *H01L 21/02* | (2006.01) |
| *H01L 29/16* | (2006.01) |
| *H01L 21/683* | (2006.01) |
| *H01L 21/78* | (2006.01) |
| *B23K 26/38* | (2014.01) |
| *B24B 7/22* | (2006.01) |
| *C30B 29/36* | (2006.01) |
| *B23K 26/364* | (2014.01) |
| *B23K 26/402* | (2014.01) |
| *C30B 33/06* | (2006.01) |

(Continued)

(52) U.S. Cl.
CPC ...... *H01L 21/02013* (2013.01); *B23K 26/364* (2015.10); *B23K 26/38* (2013.01); *B23K 26/402* (2013.01); *B24B 7/228* (2013.01); *C30B 29/36* (2013.01); *C30B 33/00* (2013.01); *C30B 33/06* (2013.01); *H01L 21/6835* (2013.01); *H01L 21/6836* (2013.01); *H01L 21/78* (2013.01); *H01L 29/1608* (2013.01); *H01L 33/005* (2013.01); *H01L 2221/68327* (2013.01)

(58) Field of Classification Search
CPC ........... H01L 21/02013; H01L 21/6836; H01L 21/78; H01L 29/1608; B23K 26/38; B23K 7/228

See application file for complete search history.

(56) References Cited

U.S. PATENT DOCUMENTS 9,517,530 B2 * 12/2016 Hirata .................... B23K 26/53
9,884,390 B2 *  2/2018 Hirata .................. B28D 5/0011
(Continued)

FOREIGN PATENT DOCUMENTS

| JP | 2000-94221 A | 4/2000 |
| JP | 2013-49161 A | 3/2013 |

*Primary Examiner* — Dung Van Nguyen
(74) *Attorney, Agent, or Firm* — Greer Burns & Crain Ltd.

(57) ABSTRACT

A method for producing a wafer from an ingot of single crystal SiC includes an end surface planarizing step of planarizing an end surface of the ingot, a separation layer forming step of setting a focal point of a laser beam having a transmission wavelength to single crystal SiC inside the ingot at a predetermined depth from the end surface of the ingot, the predetermined depth corresponding to the thickness of the wafer to be produced, and next applying the laser beam to the ingot to thereby form a separation layer for separating the wafer from the ingot, a hard plate providing step of providing a hard plate through an adhesive on the end surface of the ingot in which the separation layer has been formed, and a separating step of separating the wafer with the hard plate from the ingot along the separation layer.

2 Claims, 8 Drawing Sheets

(51) Int. Cl.
*C30B 33/00* (2006.01)
*H01L 33/00* (2010.01)

(56) References Cited

U.S. PATENT DOCUMENTS

| | | | | |
|---|---|---|---|---|
| 2009/0298263 A1* | 12/2009 | Watanabe | ............... | H01L 21/78 438/463 |
| 2012/0100694 A1* | 4/2012 | Kajiyama | ............... | H01L 21/78 438/462 |

* cited by examiner

SIC WAFER PRODUCING METHOD

BACKGROUND OF THE INVENTION

Field of the Invention

The present invention relates to an SiC wafer producing method for producing an SiC wafer from a single crystal SiC ingot.

Description of the Related Art

Various devices such as integrated circuits (ICs), Large Scale Integrations (LSIs), and light emitting diodes (LEDs) are formed by forming a functional layer on the front side of a wafer formed of Si (silicon) or $Al_2O_3$ (sapphire) and partitioning this functional layer into a plurality of separate regions along a plurality of division lines. Further, power devices or optical devices such as LEDs are formed by forming a functional layer on the front side of a wafer formed of single crystal SiC (silicon carbide) and partitioning this functional layer into a plurality of separate regions along a plurality of division lines. The division lines of such a wafer having these devices are processed by a processing apparatus such as a cutting apparatus and a laser processing apparatus to thereby divide the wafer into a plurality of individual device chips corresponding to the respective devices. The device chips thus obtained are used in various electrical equipment such as mobile phones and personal computers.

In general, the wafer on which the devices are to be formed is produced by slicing a cylindrical ingot with a wire saw. Both sides of the wafer sliced from the ingot are polished to a mirror finish (see JP2000-94221A). However, when the ingot is cut by the wire saw and both sides of each wafer are polished to obtain the product, a large proportion (70% to 80%) of the ingot is discarded to cause a problem of poor economy. In particular, a single crystal SiC ingot has high hardness and it is therefore difficult to cut this ingot with the wire saw. Accordingly, considerable time is required for cutting of the ingot, causing a reduction in productivity. Furthermore, since this ingot is high in unit price, there is a problem in efficiently producing a wafer in this prior art.

A technique for solving this problem has been proposed (see JP2013-49161A). This technique includes the steps of setting the focal point of a laser beam having a transmission wavelength to single crystal SiC inside a single crystal SiC ingot, next applying the laser beam to the SiC ingot as scanning the laser beam on the SiC ingot to thereby form modified layers in a separation plane previously set inside the SiC ingot, and next breaking the SiC ingot along the separation plane where the modified layers have been formed, thus separating an SiC wafer from the SiC ingot.

SUMMARY OF THE INVENTION

However, in separating the SiC wafer from the SiC ingot or in forming devices on the front side of the SiC wafer, the thickness of the SiC wafer to be separated from the SiC ingot is set to approximately 700 to 800 μm, so as to strengthen the SiC wafer. Further, in order to improve heat dissipation in dividing the SiC wafer into the individual device chips, the back side of the SiC wafer is ground by a thickness of approximately 500 to 600 μm to thereby reduce the thickness of the SiC wafer to approximately 200 μm. Accordingly, there is a problem in producing the SiC wafer from the SiC ingot more economically.

It is therefore an object of the present invention to provide an SiC wafer producing method for producing an SiC wafer from a single crystal SiC ingot more economically.

In accordance with an aspect of the present invention, there is provided an SiC wafer producing method for producing an SiC wafer from a single crystal SiC ingot, the SiC wafer producing method including an end surface planarizing step of planarizing an end surface of the SiC ingot; a separation layer forming step of setting a focal point of a laser beam having a transmission wavelength to single crystal SiC inside the SiC ingot at a predetermined depth from the end surface of the SiC ingot, the predetermined depth corresponding to the thickness of the SiC wafer to be produced, after performing the end surface planarizing step, and next applying the laser beam to the SiC ingot to thereby form a separation layer for separating the SiC wafer from the SiC ingot; a hard plate providing step of providing a hard plate through an adhesive on the end surface of the SiC ingot after performing the separation layer forming step; a separating step of separating the SiC wafer with the hard plate from the SiC ingot along the separation layer after performing the hard plate providing step; a separation surface planarizing step of planarizing a separation surface of the SiC wafer separated from the SiC ingot after performing the separating step; and a device forming step of forming devices on the separation surface of the SiC wafer after performing the separation surface planarizing step.

Preferably, the SiC ingot has a first surface, a second surface opposite to the first surface, a c-axis extending from the first surface to the second surface, and a c-plane perpendicular to the c-axis, the c-axis being inclined by an off angle with respect to a normal to the first surface, the off angle being formed between the c-plane and the first surface; the separation layer forming step including a modified layer forming step of setting a focal point of a pulsed laser beam having a transmission wavelength to single crystal SiC inside the SiC ingot at a predetermined depth from the first surface, the predetermined depth corresponding to the thickness of the SiC wafer to be produced, and next applying the pulsed laser beam to the SiC ingot as relatively moving the SiC ingot and the focal point in a first direction perpendicular to a second direction where the off angle is formed, thereby forming a linear modified layer inside the SiC ingot at the predetermined depth so as to extend in the first direction and cracks extending from the modified layer in opposite directions along the c-plane, the modified layer being formed in such a manner that SiC is decomposed into Si and C by the pulsed laser beam first applied, and the pulsed laser beam next applied is absorbed by C previously produced to continue the decomposition of SiC into Si and C in a chain reaction manner with the relative movement of the SiC ingot and the focal point in the first direction; and an indexing step of relatively moving the SiC ingot and the focal point in the second direction by a predetermined index amount; the modified layer forming step and the indexing step being repeated plural times to thereby form the separation layer inside the SiC ingot in the condition where a plurality of linear modified layers are arranged at given intervals in the second direction so as to be connected through the cracks.

In the SiC wafer producing method of the present invention, the SiC wafer is reinforced by the hard plate. Accordingly, in separating the SiC wafer from the SiC ingot or in forming the devices on the front side of the SiC wafer, it is unnecessary to increase the thickness of the SiC wafer to a relatively large thickness of approximately 700 to 800 μm and thereby to strengthen the SiC wafer for the purpose of preventing damage to the SiC wafer. That is, even when the thickness of the SiC wafer is reduced to a relatively small thickness of approximately 200 μm, the damage to the SiC wafer can be prevented in separating the SiC wafer from the SiC ingot or in forming the devices on the front side of the SiC wafer according to the present invention.

Thus, the thickness of the SiC wafer to be separated from the SiC ingot can be reduced to a relatively small thickness of approximately 200 μm in the present invention. Accordingly, in reducing the thickness of the SiC wafer by grinding, so as to improve heat dissipation, the amount of the SiC wafer to be ground (to be discarded) can be reduced. Furthermore, the number of wafers that can be produced from the SiC ingot can be increased, so that the SiC wafer can be produced from the SiC ingot more economically.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
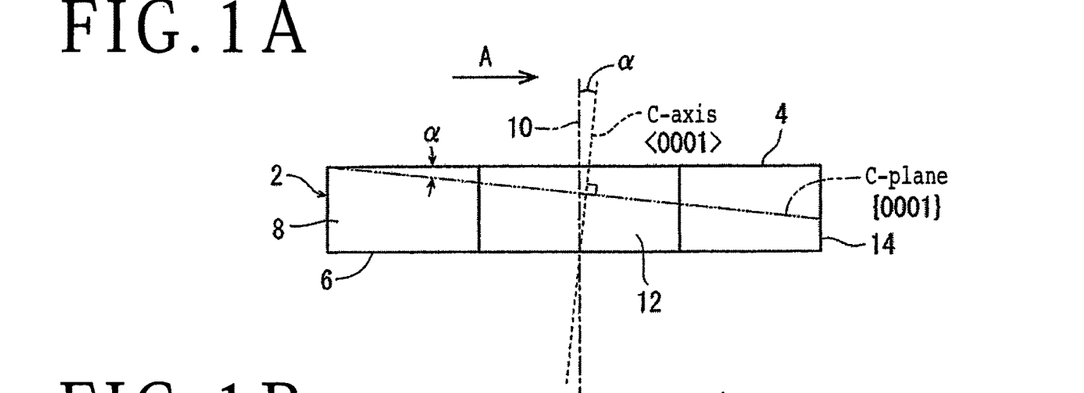
FIG. 1A is an elevational view of a single crystal SiC ingot.
Figure 1B:
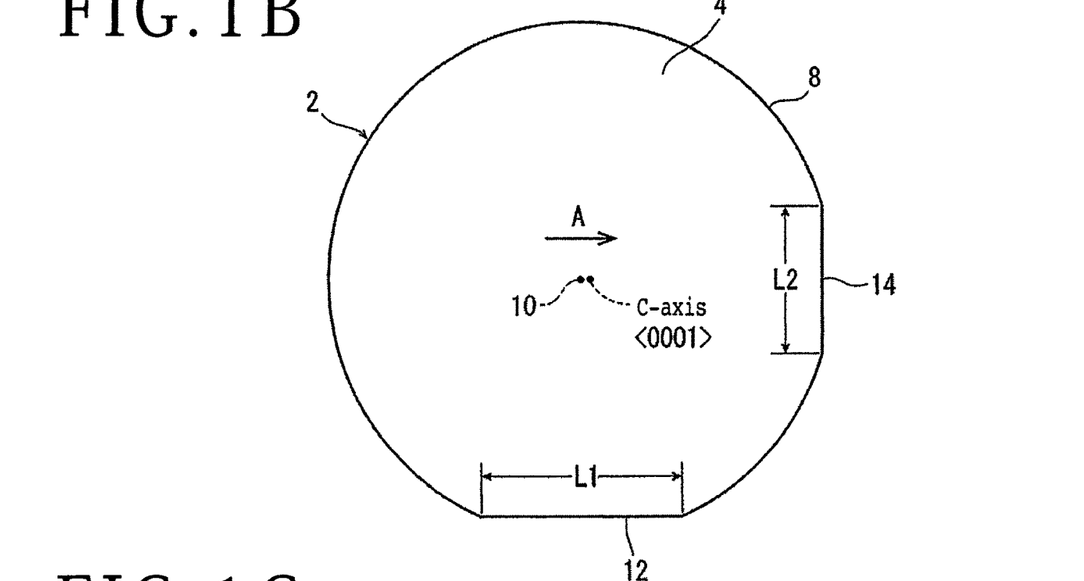
FIG. 1B is a plan view of the SiC ingot depicted in FIG. 1A.
Figure 1C:
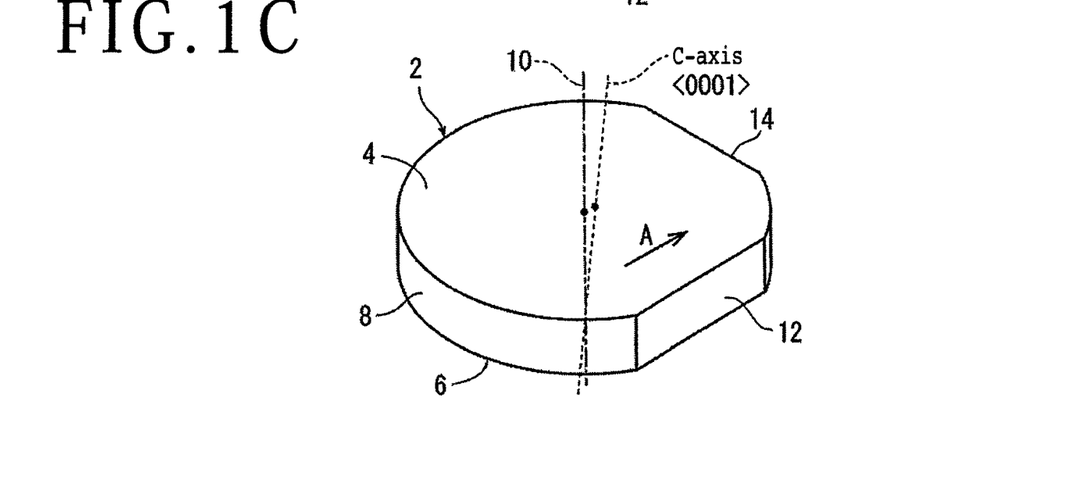
FIG. 1C is a perspective view of the SiC ingot depicted in FIG. 1A.

A preferred embodiment of the wafer producing method according to the present invention will now be described with reference to the drawings. FIGS. 1A to 1C depict a substantially cylindrical, hexagonal single crystal SiC ingot 2 (which will be hereinafter referred to simply as "ingot 2") as a workpiece to be processed. The ingot 2 has a substantially circular first surface 4, a substantially circular second surface 6 opposite to the first surface 4, a substantially cylindrical surface 8 formed so as to connect the first surface 4 and the second surface 6, a c-axis (<0001> direction) extending from the first surface 4 to the second surface 6, and a c-plane ({0001} plane) perpendicular to the c-axis. In the ingot 2, the c-axis is inclined by an off angle α (e.g., α=1, 3, or 6 degrees) with respect to a normal 10 to the first surface 4. The off angle α is formed between the c-plane and the first surface 4. The direction of formation of the off angle α (i.e., the direction of inclination of the c-axis) is depicted by an arrow A in FIGS. 1A to 1C. Further, the cylindrical surface 8 of the ingot 2 is formed with a first orientation flat 12 and a second orientation flat 14, which are rectangular as viewed in side elevation and function to indicate crystal orientation. The first orientation flat 12 is parallel to the direction A of formation of the off angle α, and the second orientation flat 14 is perpendicular to the direction A of formation of the off angle α. As depicted in FIG. 1B, which is a plan view taken in the direction of extension of the normal 10, the length L2 of the second orientation flat 14 is set shorter than the length L1 of the first orientation flat 12 (L2<L1).

Figure 2:
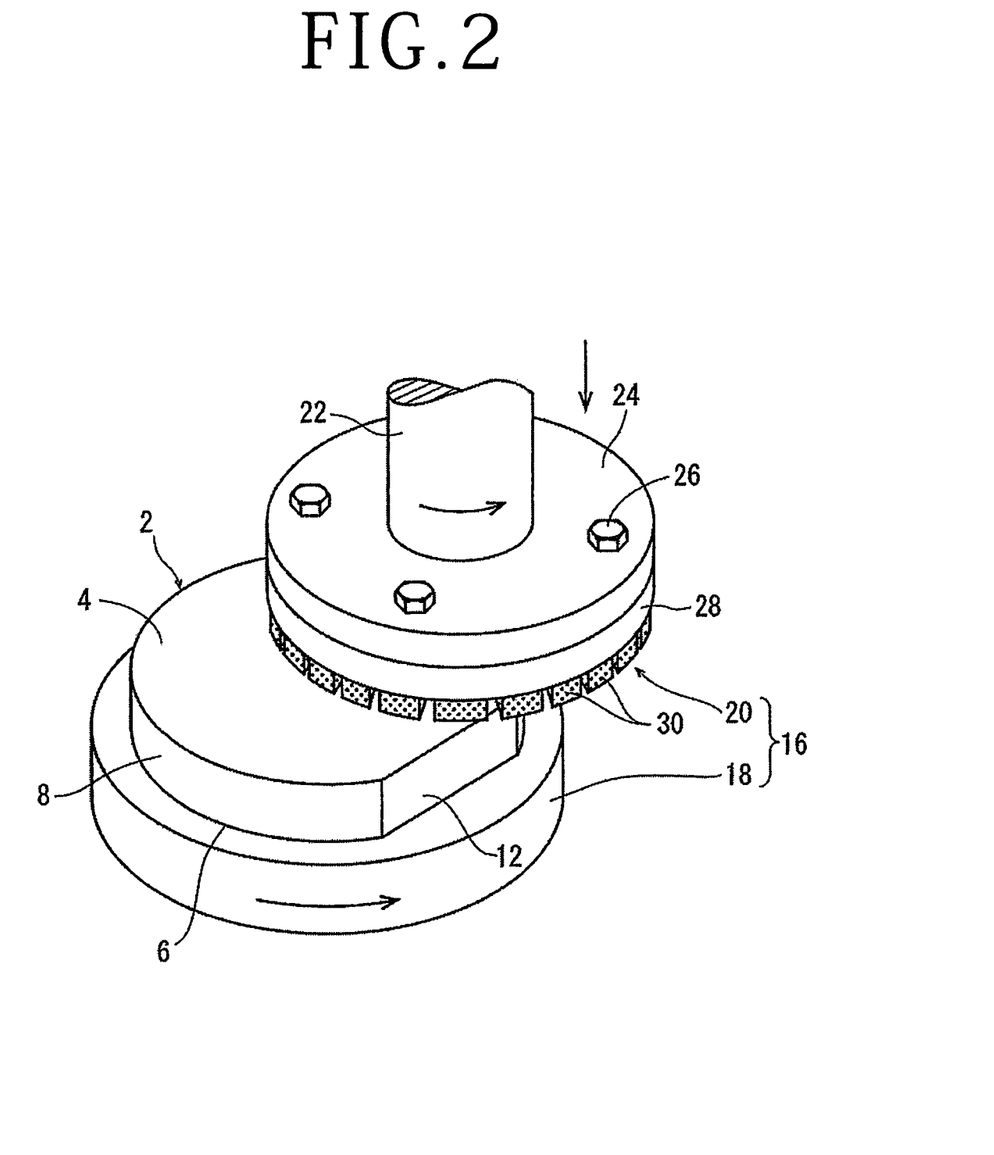
FIG. 2 is a perspective view depicting an end surface planarizing step.

In the wafer producing method according to this preferred embodiment, an end surface planarizing step is first performed to planarize an end surface of the ingot 2. The end surface planarizing step may be performed by using a grinding apparatus 16, a part of which is depicted in FIG. 2. The grinding apparatus 16 includes a chuck table 18 and grinding means 20. The chuck table 18 has an upper surface for holding a workpiece thereon under suction. The chuck table 18 is rotatable by rotating means (not depicted) about an axis extending in a vertical direction. The grinding means 20 includes a cylindrical spindle 22 having a vertical axis of rotation, the spindle 22 being connected to a motor (not depicted), and also includes a disk-shaped wheel mount 24 fixed to the lower end of the spindle 22. An annular grinding wheel 28 is fixed to the lower surface of the wheel mount 24 by bolts 26. A plurality of abrasive members 30 are fixed to the lower surface of the grinding wheel 28 so as to be arranged annularly at given intervals along the outer circumference of the grinding wheel 28. As depicted in FIG. 2, the center of rotation of the grinding wheel 28 is deviated from the center of rotation of the chuck table 18, so as to obtain a configuration such that the abrasive members 30 annularly arranged pass through the center of rotation of the chuck table 18 as viewed in plan. Accordingly, when both the chuck table 18 and the grinding wheel 28 are rotated in the same direction and the abrasive members 30 fixed to the grinding wheel 28 come into contact with the upper surface of the workpiece held on the upper surface of the chuck table 18, the upper surface of the workpiece can be entirely ground by the abrasive members 30.

In the end surface planarizing step, the ingot 2 is held under suction on the upper surface of the chuck table 18 of the grinding apparatus 16 depicted in FIG. 2 in the condition where the first surface 4 of the ingot 2 as the end surface to be planarized is oriented upward. As a modification, the ingot 2 may be fixed to the chuck table 18 in the condition where an adhesive (e.g., epoxy resin adhesive) is interposed between the second surface 6 of the ingot 2 as the other end surface opposite to the end surface to be planarized and the upper surface of the chuck table 18. Thereafter, the chuck table 18 is rotated by the rotating means at a predetermined speed (e.g., 300 rpm) in a counterclockwise direction as viewed in plan. Further, the spindle 22 is rotated by the motor at a predetermined speed (e.g., 6000 rpm) in a counterclockwise direction as viewed in plan. Thereafter, the spindle 22 is lowered by elevating means (not depicted) included in the grinding apparatus 16 until the abrasive members 30 fixed to the grinding wheel 28 come into contact with the first surface 4 of the ingot 2 as the end surface to be planarized. Thereafter, the spindle 22 is further lowered at a predetermined feed speed (e.g., 0.1 µm/second) to thereby grind the first surface 4 of the ingot 2. Thus, the first surface 4 of the ingot 2 as the end surface of the ingot 2 can be planarized by grinding.

Figure 3A:
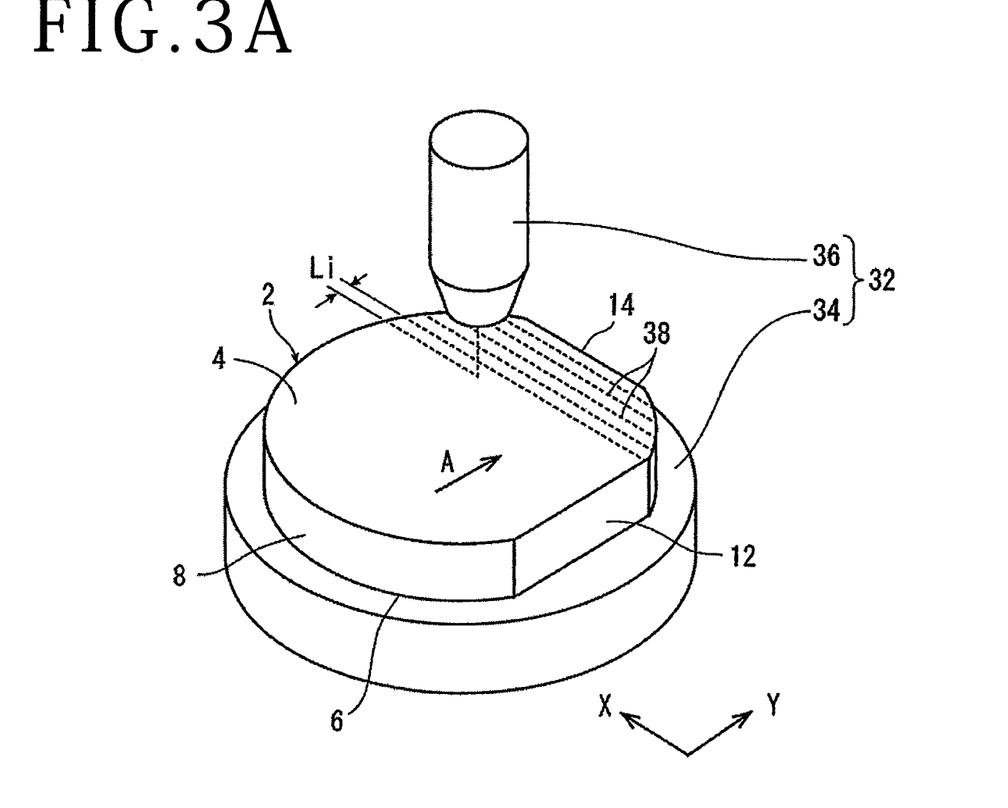
FIG. 3A is a perspective view depicting a separation layer forming step.

After performing the end surface planarizing step, a separation layer forming step is performed to form a separation layer for separating a wafer from the ingot 2. The separation layer forming step may be performed by using a laser processing apparatus 32, a part of which is depicted in FIG. 3A. The laser processing apparatus 32 includes a chuck table 34 and focusing means 36. The chuck table 34 has an upper surface for holding a workpiece thereon under suction. The chuck table 34 is adapted to be rotated about a vertical axis by rotating means (not depicted). Further, the chuck table 34 is adapted to be moved both in an X direction by X moving means (not depicted) and in a Y direction by Y moving means (not depicted). The focusing means 36 includes a focusing lens (not depicted) for focusing a pulsed laser beam LB oscillated from a pulsed laser beam oscillator (not depicted) included in the laser processing apparatus 32, in which the pulsed laser beam LB focused by the focusing lens is applied to the workpiece held on the upper surface of the chuck table 34. The X direction is defined as the direction depicted by an arrow X in FIGS. 3A and 3B, and the Y direction is defined as the direction depicted by an arrow Y in FIG. 3A, which is perpendicular to the X direction in an XY plane. The XY plane defined by the X direction and the Y direction is a substantially horizontal plane.

In the separation layer forming step, the ingot 2 is held under suction on the upper surface of the chuck table 34 of the laser processing apparatus 32 depicted in FIG. 3A in the condition where the first surface 4 of the ingot 2 as the end surface planarized in the previous step is oriented upward. As a modification, the ingot 2 may be fixed to the chuck table 34 in the condition where an adhesive (e.g., epoxy resin adhesive) is interposed between the second surface 6 of the ingot 2 as the other end surface opposite to the end surface planarized in the previous step and the upper surface of the chuck table 34. Thereafter, the ingot 2 is imaged by imaging means (not depicted) included in the laser processing apparatus 32, from the upper side of the first surface 4 of the ingot 2 held on the chuck table 34. Thereafter, the X moving means, the Y moving means, and the rotating means are operated to move and rotate the chuck table 34 according to the image of the ingot 2 detected by the imaging means, thereby adjusting the orientation of the ingot 2 to a predetermined orientation and also adjusting the positional relation between the ingot 2 and the focusing means 36 in the XY plane. In adjusting the orientation of the ingot 2 to a predetermined orientation, the first orientation flat 12 is made parallel to the Y direction and the second orientation flat 14 is made parallel to the X direction as depicted in FIG. 3A. Accordingly, the direction A of formation of the off angle α is made parallel to the Y direction, and the direction perpendicular to the direction A of formation of the off angle α is made parallel to the X direction.

Figure 3B:
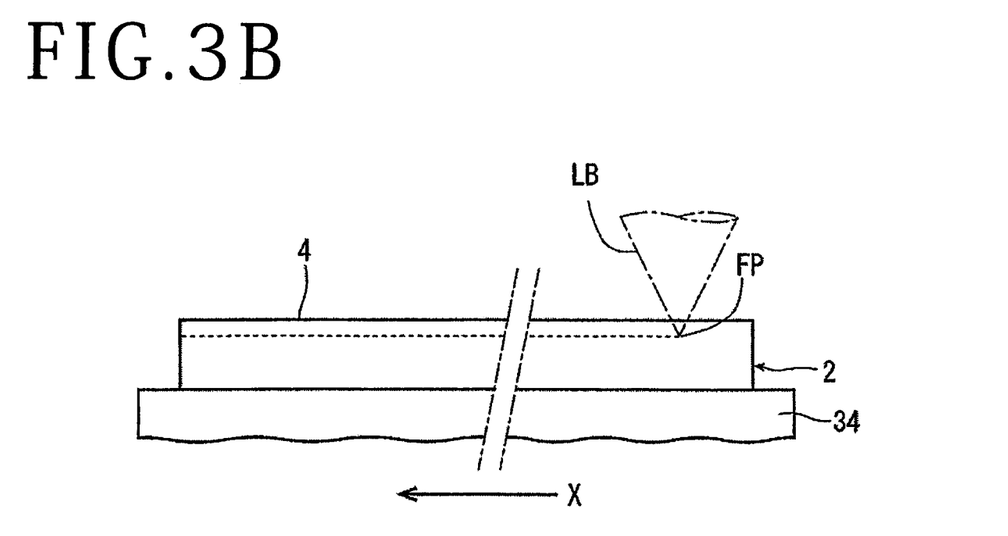
FIG. 3B is an elevational view depicting the separation layer forming step.

Thereafter, focal position adjusting means (not depicted) included in the laser processing apparatus 32 is operated to vertically move the focusing means 36, thereby adjusting a focal point FP at a predetermined depth (e.g., approximately 200 µm) from the first surface 4 of the ingot 2 as the end surface planarized, the predetermined depth corresponding to the thickness of a wafer to be produced. Thereafter, as depicted in FIG. 3B, a pulsed laser beam LB having a transmission wavelength to single crystal SiC is applied from the focusing means 36 to the ingot 2 as relatively moving the ingot 2 and the focal point FP in the X direction (i.e., in the direction perpendicular to the direction A of formation of the off angle α) (modified layer forming step). More specifically, in the modified layer forming step in this preferred embodiment, the pulsed laser beam LB is applied from the focusing means 36 to the ingot 2 as moving the chuck table 34 relative to the focal point FP at a predetermined feed speed in the X direction by operating the X moving means in the condition where the focal point FP is fixed in position.

Figure 4A:
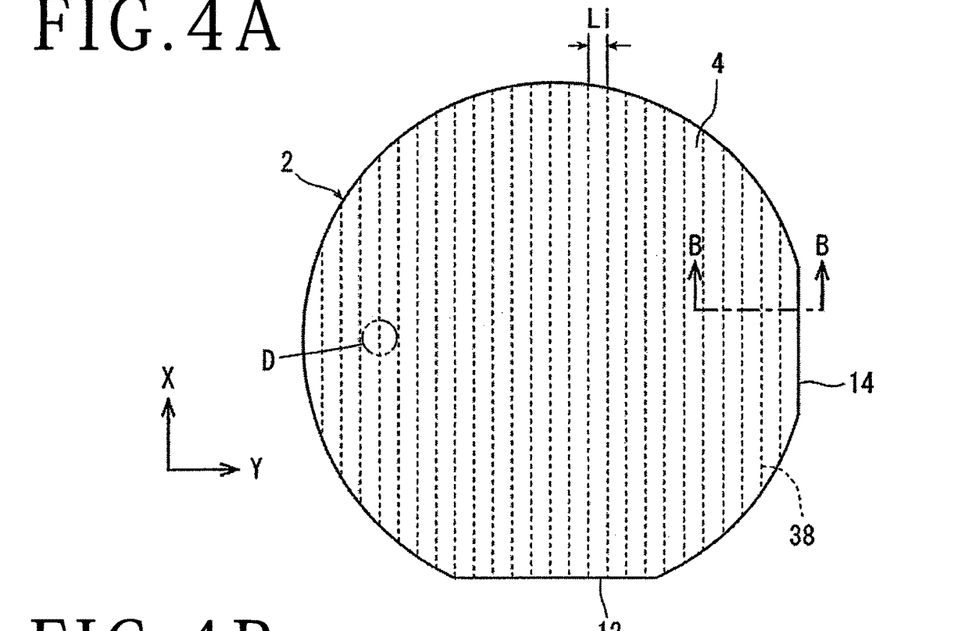
FIG. 4A is a plan view of the SiC ingot in the condition where a separation layer has been formed in the SiC ingot by performing the separation layer forming step.
Figure 4B:
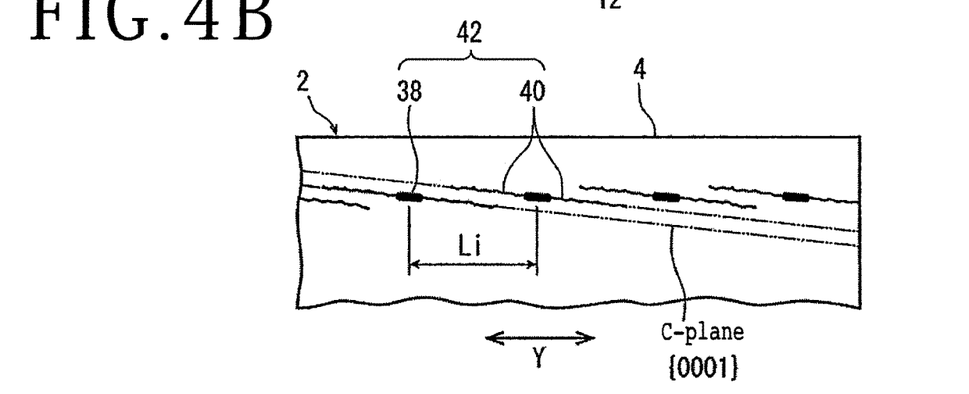
FIG. 4B is a cross section taken along the line B-B in FIG. 4A.
Figure 4C:
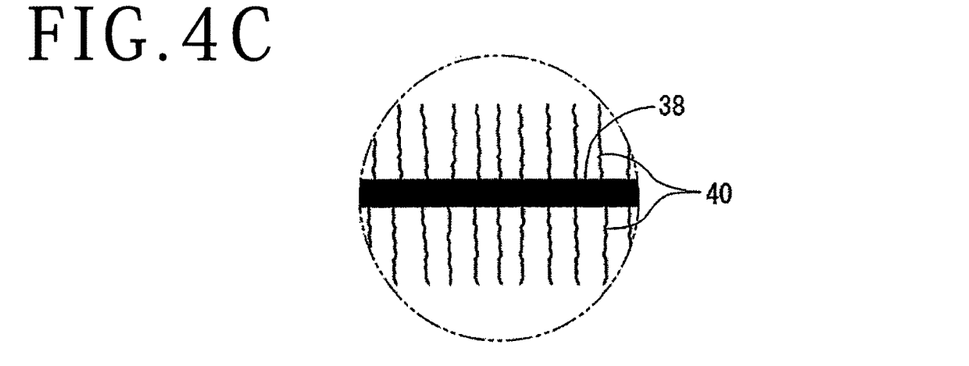
FIG. 4C is an enlarged view of an encircled area D depicted in FIG. 4A.

In the modified layer forming step, the pulsed laser beam LB is initially applied to the ingot 2 to thereby decompose SiC into Si (silicon) and C (carbon). Thereafter, the pulsed laser beam LB is next applied to the ingot 2 and absorbed by C previously produced. Thus, SiC is decomposed into Si and C in a chain reaction manner with the movement of the chuck table 34 in the X direction to thereby linearly form a modified layer 38 extending in the X direction as depicted in FIGS. 4A and 4B. At the same time, cracks 40 are also formed so as to propagate from the modified layer 38 in opposite directions along the c-plane as depicted in FIGS. 4B and 4C. In the modified layer forming step, the chuck table 34 is fed in the X direction (the ingot 2 and the focal point FP are relatively moved in the X direction) so that the adjacent spots of the pulsed laser beam LB applied to the ingot 2 are overlapped with each other at the depth where the modified layer 38 is formed (i.e., a plurality of circular modified portions are overlapped with each other to form the linear modified layer 38). Accordingly, the pulsed laser beam LB is applied again to the modified layer 38 (to the circular modified portion previously formed) where SiC has been decomposed into Si and C.

In order to ensure that the adjacent spots of the pulsed laser beam LB are overlapped with each other in the modified layer forming step, the relation of G=(V/F)−D and G<0 must hold, where F is the repetition frequency of the pulsed laser beam LB, V is the relative speed between the ingot 2 and the focal point FP, and D is the diameter of each spot. Further, the overlap rate of the adjacent spots is defined as |G|/D.

After performing the modified layer forming step along a line in the X direction, an indexing step is performed in such a manner the ingot 2 and the focal point FP are relatively moved by a predetermined index amount Li in the Y direction (i.e., in the direction A of formation of the off angle α). More specifically, in the indexing step in this preferred embodiment, the chuck table 34 is moved relative to the focal point FP by the predetermined index amount Li in the Y direction by operating the Y moving means in the condition where the focal point FP is fixed in position. Thereafter, the modified layer forming step and the indexing step are repeated plural times to thereby form a separation layer 42 inside the ingot 2 at the predetermined depth corresponding to the thickness of a wafer to be produced as depicted in FIG. 4B, the separation layer 42 being composed of plural modified layers 38 and cracks 40. In the separation layer 42, any adjacent ones of the plural modified layers 38 are connected through the cracks 40 in the direction A of formation of the off angle α. For example, the separation layer forming step is performed under the following processing conditions.

Figure 5:
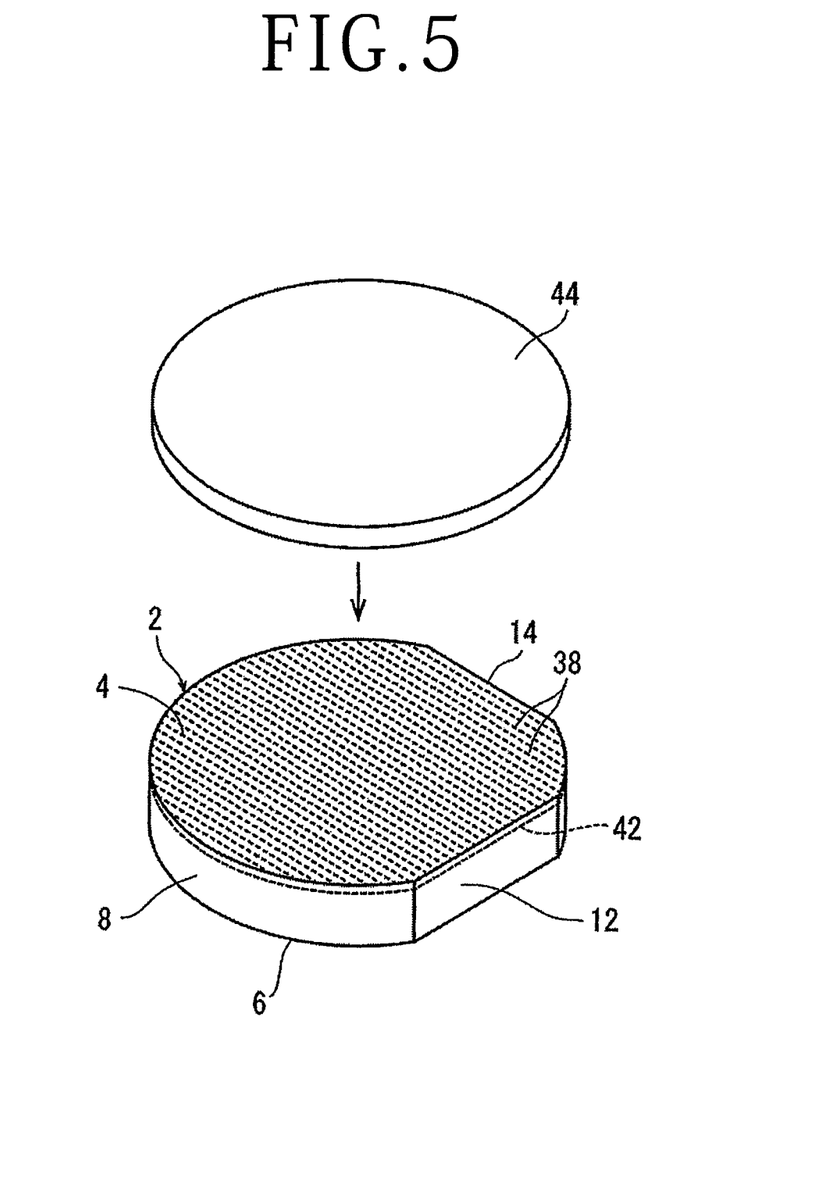
FIG. 5 is a perspective view depicting a hard plate providing step.

Wavelength of the pulsed laser beam: 1064 nm
Repetition frequency: 80 kHz
Average power: 3.2 W
Pulse width: 4 ns
Diameter of the focal point: 3 μm
Numerical aperture (NA) of the focusing lens: 0.43
Index amount: 250 to 400 μm
Feed speed: 120 to 260 mm/second After performing the separation layer forming step, a hard plate providing step is performed to provide a hard plate 44 through an adhesive on the first surface 4 of the ingot 2 in which the separation layer 42 has been formed as depicted in FIG. 5. The hard plate 44 is a disk-shaped member having a thickness of approximately 5 mm. The hard plate 44 is formed of glass, ceramic, or synthetic resin such as polyethylene terephthalate (PET) and acrylic resin. The material of the hard plate 44 may be suitably selected according to various steps to be performed after performing the hard plate providing step. The hard plate 44 has a contact surface adapted to come into contact with the first surface 4 of the ingot 2 as the end surface planarized. Preferably, this contact surface of the hard plate 44 has substantially the same size as that of the first surface 4 of the ingot 2 or has a size larger than that of the first surface 4 of the ingot 2. Further as the adhesive to be used in the hard plate providing step, cyanoacrylate adhesive (e.g., Aron Alpha (registered trademark) manufactured by Toagosei Co., Ltd.) may be used.

Figure 6A:
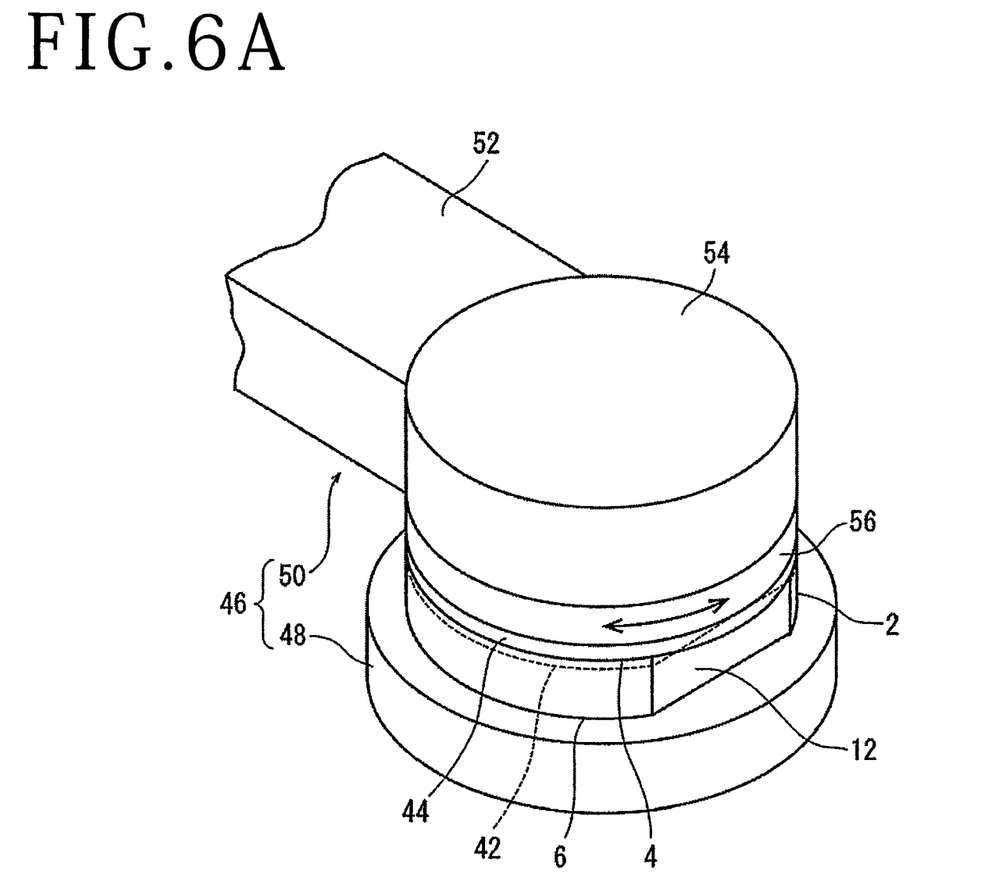
FIG. 6A is a perspective view depicting a separating step.

After performing the hard plate providing step, a separating step is performed to separate a wafer with the hard plate 44 from the ingot 2 along the separation layer 42. The separating step may be performed by using a separating apparatus 46, a part of which is depicted in FIG. 6A. The separating apparatus 46 includes a chuck table 48 and separating means 50. The chuck table 48 has an upper surface for holding a workpiece thereon under suction. The separating means 50 includes an arm 52 extending in a substantially horizontal direction and a motor 54 provided at the front end of the arm 52. A disk-shaped suction member 56 is connected to the lower surface of the motor 54 so as to be rotatable about a vertical axis. The suction member 56 has a lower surface adapted to hold a workpiece under suction. Further, ultrasonic vibration applying means (not depicted) is built in the suction member 56 to apply ultrasonic vibration to the lower surface of the suction member 56.

Figure 6B:
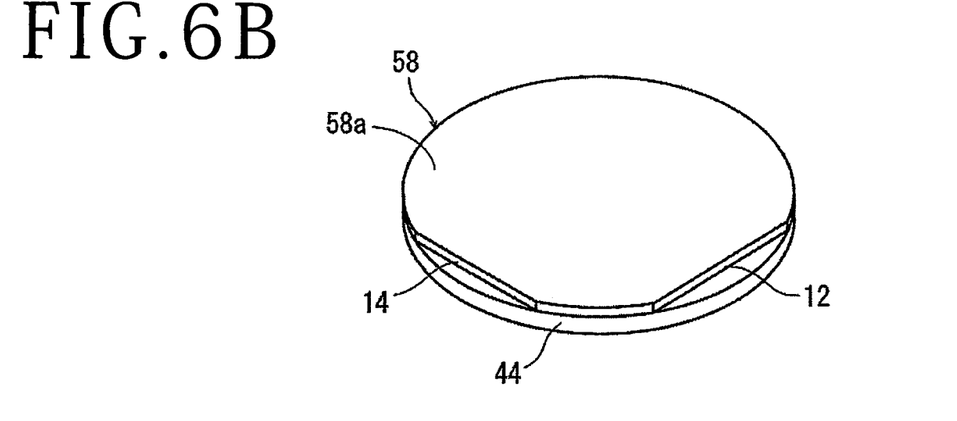
FIG. 6B is a perspective view of a wafer with a hard plate as separated from the SiC ingot by performing the separating step.

In the separating step, the ingot 2 with the hard plate 44 is held under suction on the upper surface of the chuck table 48 of the separating apparatus 45 in the condition where the hard plate 44 is oriented upward. As a modification, the ingot 2 with the hard plate 4 may be fixed to the chuck table 48 in the condition where an adhesive (e.g., epoxy resin adhesive) is interposed between the second surface 6 of the ingot 2 and the upper surface of the chuck table 48. Thereafter, elevating means (not depicted) included in the separating apparatus 46 is operated to lower the arm 52 until the lower surface of the suction member 56 comes into contact with the upper surface of the hard plate 44, so that the upper surface of the hard plate 44 is held by the lower surface of the suction member 56 under suction as depicted in FIG. 6A. Thereafter, the ultrasonic vibration applying means is operated to apply ultrasonic vibration to the lower surface of the suction member 56. At the same time, the motor 54 is operated to rotate the suction member 56. As a result, a part of the ingot 2 can be separated as a wafer 58 (see FIG. 6B) along the separation layer 42 together with the hard plate 44. FIG. 6B is a perspective view depicting the wafer 58 with the hard plate 44 as separated from the ingot 2 along the separation layer 42 in the condition where a separation surface 58a of the wafer 58 is oriented upward.

Figure 7:
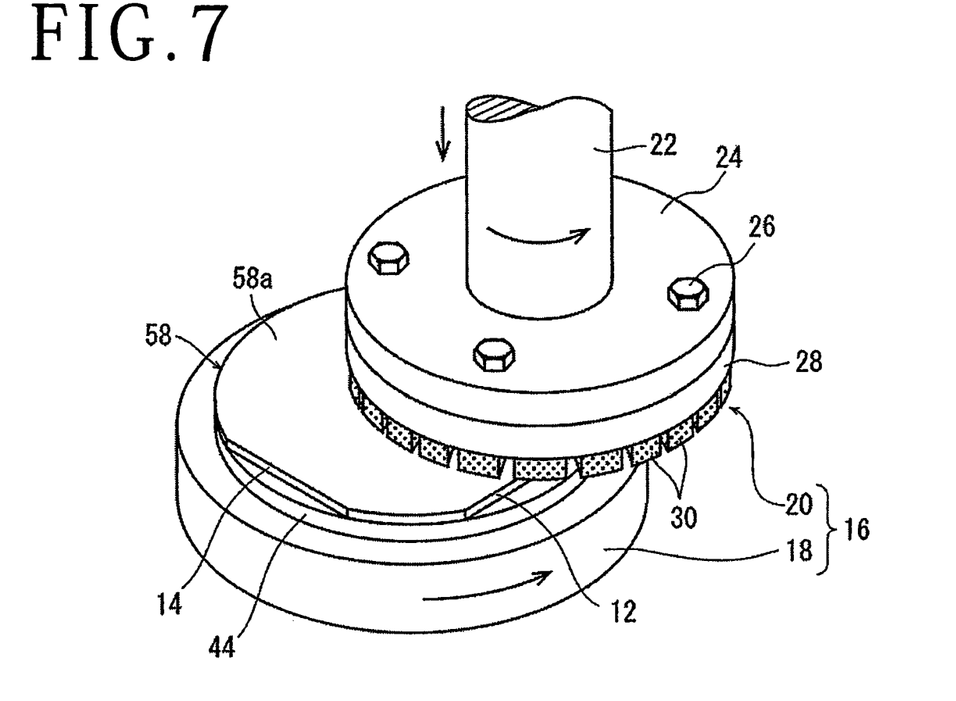
FIG. 7 is a perspective view depicting a separation surface planarizing step.

After performing the separating step, a separation surface planarizing step is performed to planarize the separation surface 58a of the wafer 58 separated from the ingot 2 as depicted in FIG. 7. The separation surface planarizing step may be performed by using the grinding apparatus 16 mentioned above with reference to FIG. 2. As depicted in FIG. 7, the separation surface planarizing step is performed in the condition where the hard plate 44 is bonded to the wafer 58. In the separation surface planarizing step, the wafer 58 with the hard plate 44 is held under suction on the upper surface of the chuck table 18 of the grinding apparatus 16 in the condition where the separation surface 58a of the wafer 58 is oriented upward (i.e., the hard plate 44 is oriented downward). As a modification, the wafer 58 with the hard plate 44 may be fixed to the chuck table 18 in the condition where an adhesive (e.g., epoxy resin adhesive) is interposed between the lower surface of the hard plate 44 and the upper surface of the chuck table 18. Thereafter, the chuck table 18 is rotated by the rotating means at a predetermined speed (e.g., 300 rpm) counterclockwise as viewed in plan. Further, the spindle 22 is rotated by the motor at a predetermined speed (e.g., 6000 rpm) counterclockwise as viewed in plan. Thereafter, the elevating means (not depicted) in the grinding apparatus 16 is operated to lower the spindle 22 until the abrasive members 30 come into contact with the separation surface 58a of the wafer 58. Thereafter, the spindle 22 is further lowered at a predetermined feed speed (e.g., 0.1 μm/second) to thereby grind the separation surface 58a of the wafer 58. Thus, the separation surface 58a of the wafer 58 separated from the ingot 2 can be planarized by grinding.

Figure 8:
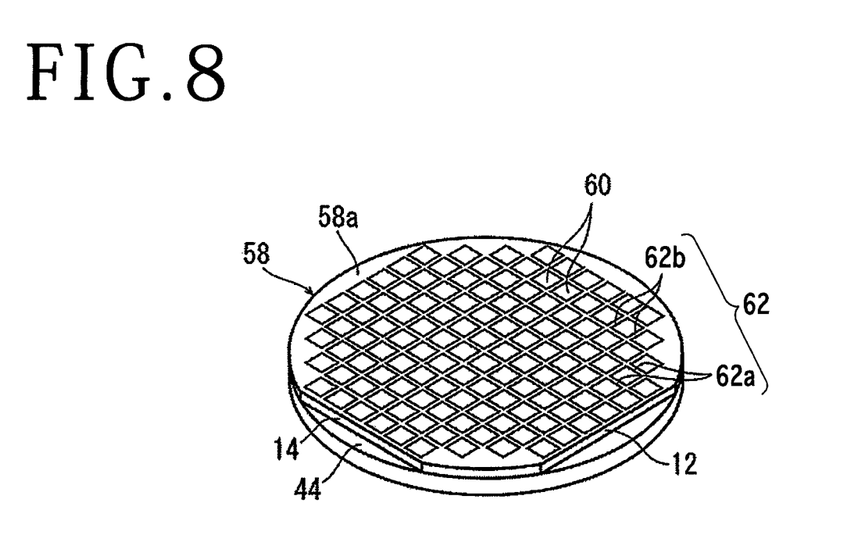
FIG. 8 is a perspective view of the wafer with the hard plate in the condition where devices have been formed on the wafer by performing a device forming step.
Figure 9:
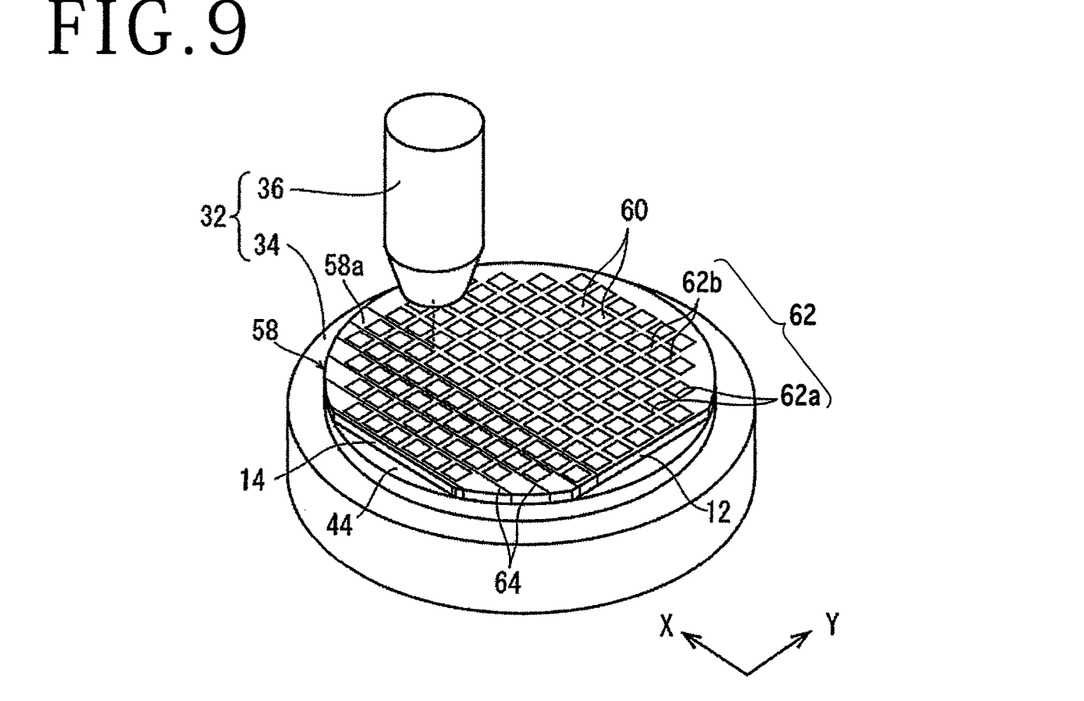
FIG. 9 is a perspective view depicting a dividing step.

After performing the separation surface planarizing step, a device forming step is performed to form a plurality of devices 60 such as power devices and LEDs on the separation surface 58a of the wafer 58 as depicted in FIG. 8. The device forming step is performed in the condition where the hard plate 44 is bonded to the wafer 58. As depicted in FIG. 8, the plural devices 60 are formed in a plurality of rectangular separate regions defined by a plurality of crossing division lines 62 on the separation surface 58a of the wafer 58. The crossing division lines 62 are composed of first division lines 62a and second division lines 62b perpendicular to the first division lines 62a.

After performing the device forming step, a dividing step is performed to divide the wafer 58 into a plurality of individual device chips corresponding to the respective devices 60. The dividing step may be performed by using the laser processing apparatus 32 mentioned above with reference to FIG. 3A. The dividing step is performed in the condition where the hard plate 44 is bonded to the wafer 58. In the dividing step, the wafer 58 with the hard plate 44 is held under suction on the upper surface of the chuck table 34 of the laser processing apparatus 32 in the condition where the separation surface 58a of the wafer 58 on which the devices 60 have been formed is oriented upward (i.e., the hard plate 44 is oriented downward). As a modification, the wafer 58 with the hard plate 44 may be fixed to the chuck table 34 in the condition where an adhesive (e.g., epoxy resin adhesive) is interposed between the lower surface of the hard plate 44 and the upper surface of the chuck table 34. Thereafter, the wafer 58 is imaged by the imaging means of the laser processing apparatus 32 from the upper side of the wafer 58. Thereafter, the X moving means, the Y moving means, and the rotating means of the laser processing apparatus 32 are operated to move and rotate the chuck table 34 according to the image of the wafer 58 detected by the imaging means, thereby making the first division lines 62a parallel to the X direction and making the second division lines 62b parallel to the Y direction. Further, one end of a target one of the first division lines 62a is positioned directly below the focusing means 36. Thereafter, the focal position adjusting means of the laser processing apparatus 32 is operated to vertically move the focusing means 36, thereby setting the focal point FP on the target first division line 62a of the wafer 58. Thereafter, a pulsed laser beam LB having an absorption wavelength to single crystal SiC is applied from the focusing means 36 to the wafer 58 as relatively moving the wafer 58 and the focal point FP in the X direction from one end of the target first division line 62a to the other end thereof (division groove forming step such as ablation). More specifically, in the dividing step in this preferred embodiment, the pulsed laser beam LB is applied from the focusing means 36 to the wafer 58 as moving the chuck table 34 relative to the focal point FP at a predetermined feed speed in the X direction by operating the X moving means in the condition where the focal point FP is fixed in position.

Figure 10:
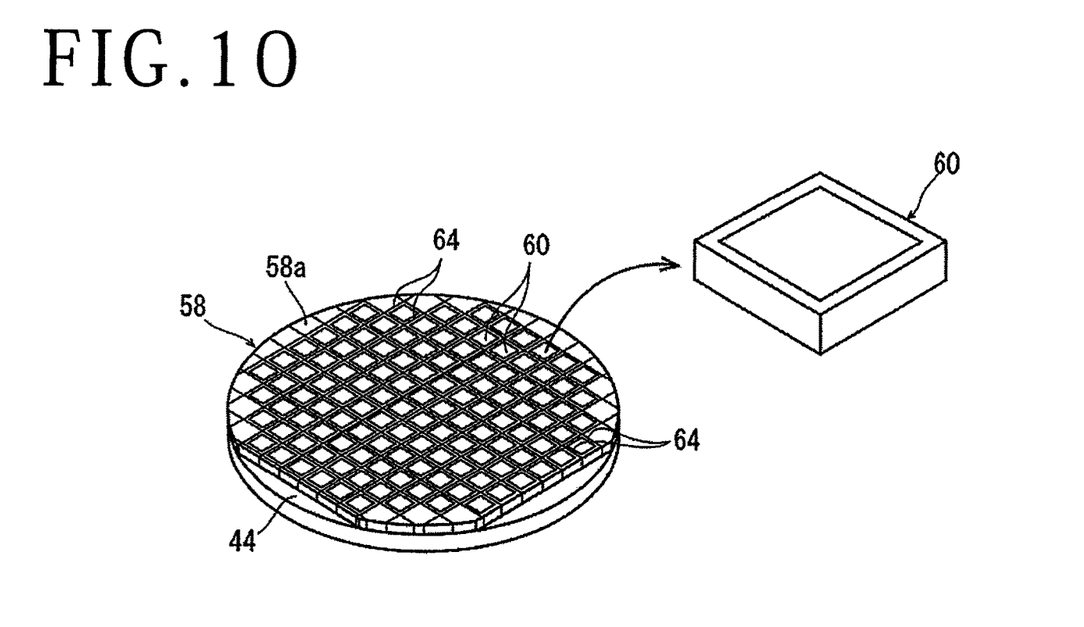
FIG. 10 is a perspective view of the wafer with the hard plate in the condition where the wafer has been divided into individual device chips by performing the dividing step.

After performing the division groove forming step along the target first division groove 62a, an indexing step is performed in such a manner that the wafer 58 and the focal point FP are relatively moved in the Y direction by an amount corresponding to the pitch of the first division lines 62a. More specifically, in the indexing step in this preferred embodiment, the chuck table 34 is moved relative to the focal point FP in the Y direction by the amount corresponding to the pitch of the first division lines 62a by operating the Y moving means in the condition where the focal point FP is fixed in position. Thereafter, the division groove forming step and the indexing step are repeated plural times along all of the other first division lines 62a. Thereafter, the chuck table 34 is rotated by 90 degrees by the rotating means to similarly perform the division groove forming step and the indexing step along all of the second division lines 62b perpendicular to the first division lines 62a. Accordingly, the wafer 58 is divided along all of the crossing division lines 62 to obtain a plurality of individual device chips corresponding to the respective devices 60. In FIG. 10, reference numeral 64 denotes a plurality of crossing division grooves formed along the respective crossing division lines 62 of the wafer 58 by the dividing step.

After performing the dividing step, a pickup step is performed to pick up each of the device chips from the hard plate 44 as depicted in FIG. 10. In the pickup step, the wafer 58 with the hard plate 44 is placed on a heating plate (not depicted) in the condition where the hard plate 44 is oriented downward, and the heating plate is operated to heat the adhesive interposed between the wafer 58 and the hard plate 44. Accordingly, the adhesive is melted to reduce its adhesion. As a result, each device chip can be easily picked up from the hard plate 44 by using suitable pickup means (not depicted).

In the wafer producing method of the present invention as described above, the wafer 58 is reinforced by the hard plate 44. Accordingly, in separating the wafer 58 from the ingot 2 or in forming the devices 60 on the front side of the wafer 58, it is unnecessary to increase the thickness of the wafer 58 to a relatively large thickness of approximately 700 to 800 µm and thereby to strengthen the wafer 58 for the purpose of preventing damage to the wafer 58. That is, even when the thickness of the wafer 58 is reduced to a relatively small thickness of approximately 200 µm, the damage to the wafer 58 can be prevented in separating the wafer 58 from the ingot 2 or in forming the devices 60 on the front side of the wafer 58 according to the present invention. Thus, the thickness of the wafer 58 to be separated from the ingot 2 can be reduced to a relatively small thickness of approximately 200 µm in the present invention. Accordingly, in reducing the thickness of the wafer 58 by grinding, so as to improve heat dissipation, the amount of the wafer 58 to be ground (to be discarded) can be reduced. Furthermore, the number of wafers that can be produced from the ingot 2 can be increased, so that the wafer 58 can be produced from the ingot 2 more economically.

In the above preferred embodiment, the ingot 2 and the focal point FP are relatively moved in the direction perpendicular to the direction A of formation of the off angle α in the modified layer forming step in the separation layer forming step, and the ingot 2 and the focal point FP are relatively moved in the direction A of formation of the off angle α in the indexing step in the separation layer forming step. As a modification, the direction of relative movement of the ingot 2 and the focal point FP in the modified layer forming step in the separation layer forming step may not coincide with the direction perpendicular to the direction A of formation of the off angle α, and the direction of relative movement of the ingot 2 and the focal point FP in the indexing step in the separation layer forming step may not coincide with the direction A of formation of the off angle α. Further, in the above preferred embodiment, the c-axis in the ingot 2 is inclined by the off angle α with respect to the normal 10 to the first surface 4, and the off angle α is formed between the c-plane and the first surface 4. As a modification, the c-axis may not be inclined with respect to the normal 10 to the first surface 4, and the off angle α between the c-plane and the first surface 4 may be 0 degree (i.e., the c-axis may coincide with the normal 10 to the first surface 4). That is, also in such a single crystal SiC ingot having a c-axis not inclined with respect to the normal to the end surface of the ingot, the wafer producing method of the present invention can be applied.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An SiC wafer producing method for producing an SiC wafer from a single crystal SiC ingot, the SiC wafer producing method comprising:
   an end surface planarizing step of planarizing an end surface of the SiC ingot;
   a separation layer forming step of setting a focal point of a laser beam having a transmission wavelength to single crystal SiC inside the SiC ingot at a predetermined depth from the end surface of the SiC ingot, the predetermined depth corresponding to a thickness of the SiC wafer to be produced, after performing the end surface planarizing step, and next applying the laser beam to the SiC ingot to thereby form a separation layer for separating the SiC wafer from the SiC ingot;
   a hard plate providing step of providing a hard plate through an adhesive on the end surface of the SiC ingot after performing the separation layer forming step;

a separating step of separating the SiC wafer with the hard plate from the SiC ingot along the separation layer after performing the hard plate providing step;

a separation surface planarizing step of planarizing a separation surface of the SiC wafer separated from the SiC ingot after performing the separating step; and a device forming step of forming devices on the separation surface of the SiC wafer after performing the separation surface planarizing step.

2. The SiC wafer producing method according to claim 1, wherein the SiC ingot has a first surface, a second surface opposite to the first surface, a c-axis extending from the first surface to the second surface, and a c-plane perpendicular to the c-axis, the c-axis being inclined by an off angle with respect to a normal to the first surface, the off angle being formed between the c-plane and the first surface;

the separation layer forming step including a modified layer forming step of setting a focal point of a pulsed laser beam having a transmission wavelength to single crystal SiC inside the SiC ingot at a predetermined depth from the first surface, the predetermined depth corresponding to the thickness of the SiC wafer to be produced, and next applying the pulsed laser beam to the SiC ingot as relatively moving the SiC ingot and the focal point in a first direction perpendicular to a second direction where the off angle is formed, thereby forming a linear modified layer inside the SiC ingot at the predetermined depth so as to extend in the first direction and cracks extending from the modified layer in opposite directions along the c-plane, the modified layer being formed in such a manner that SiC is decomposed into Si and C by the pulsed laser beam first applied, and the pulsed laser beam next applied is absorbed by C previously produced to continue the decomposition of SiC into Si and C in a chain reaction manner with the relative movement of the SiC ingot and the focal point in the first direction, and an indexing step of relatively moving the SiC ingot and the focal point in the second direction by a predetermined index amount;

the modified layer forming step and the indexing step being repeated plural times to thereby form the separation layer inside the SiC ingot in a condition where a plurality of linear modified layers are arranged at given intervals in the second direction so as to be connected through the cracks.

* * * * *